United States Patent
Kim et al.

(10) Patent No.: US 7,279,388 B2
(45) Date of Patent: Oct. 9, 2007

(54) METHOD FOR MANUFACTURING TRANSISTOR IN SEMICONDUCTOR DEVICE

(75) Inventors: Yong Soo Kim, Kyoungki-do (KR); Se Aug Jang, Kyoungki-do (KR); Jae Geun Oh, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 357 days.

(21) Appl. No.: 11/154,458

(22) Filed: Jun. 16, 2005

(65) Prior Publication Data
US 2006/0211185 A1    Sep. 21, 2006

(30) Foreign Application Priority Data
Mar. 15, 2005    (KR) .................. 10-2005-0021386

(51) Int. Cl.
*H01L 21/336* (2006.01)
(52) U.S. Cl. ................ 438/291; 438/589; 257/E21.618
(58) Field of Classification Search ................ 438/290, 438/291, 589; 257/E21.618
See application file for complete search history.

(56) References Cited

U.S. PATENT DOCUMENTS 5,994,202 A * 11/1999 Gambino et al. .... 257/E21.618
6,191,446 B1 * 2/2001 Gardner et al. ............ 438/589

FOREIGN PATENT DOCUMENTS

| JP | 2001-189456 | 7/2001 |
| KR | 10-1998-056994 | 9/1998 |
| KR | 10-1998-057015 | 9/1998 |
| KR | 1020050004352 | 1/2005 |
| KR | 102006005100 | 1/2006 |

OTHER PUBLICATIONS

Korean Patent Gazette, Jun. 8, 2006.

* cited by examiner

*Primary Examiner*—Chandra Chaudhari
(74) *Attorney, Agent, or Firm*—Ladas & Parry LLP

(57) ABSTRACT

Disclosed is a method for manufacturing a transistor in a semiconductor device, which can improve a device's refresh characteristics. The method includes: providing a silicon substrate having active and field regions; performing a channel ion implantation into the substrate; sequentially forming a hard mask film and a photoresist pattern exposing a gate formation region where the channel ion implantation occurred; performing a second, higher concentration channel ion implantation using the photoresist pattern as a mask, forming doped regions in the substrate at the gate formation region and sides; etching a hard mask using the photoresist pattern as a barrier; removing the photoresist pattern; etching the substrate using a portion of the remaining hard mask as a barrier forming a groove; removing the remaining hard mask; forming a gate in the groove where the hard mask was removed; and forming source and drain regions at both sides of the gate.

25 Claims, 5 Drawing Sheets

FIELD REGION  ACTIVE REGION  FIELD REGION

FIELD REGION  ACTIVE REGION  FIELD REGION

METHOD FOR MANUFACTURING TRANSISTOR IN SEMICONDUCTOR DEVICE

BACKGROUND OF THE INVENTION

1. Field of the Invention

The present invention relates to a method for manufacturing a semiconductor device, and more particularly, to a method for manufacturing a transistor in a semiconductor device, which can improve the refresh characteristics of the device.

2. Description of the Prior Art

Recently, as the design rule of a device pattern shrinks below 100 nm, the channel length of a cell transistor corresponding thereto is also very reduced. As a result, the existing planar transistor structures encounter limitations in realizing the Vt target of the cell transistor required in a specific device. For this reason, a method for forming a transistor with a recessed channel structure was proposed. This transistor with the recessed channel structure has a channel length secured by selectively etching a portion of the active region of a substrate, which corresponds to a region where a gate is to be formed.

FIG. 1 is a cross-sectional view for explaining a method for manufacturing a transistor in a semiconductor device according to the prior art. As shown in FIG. 1, the silicon substrate 10 is first provided which has active and field regions defined thereon and the device isolation film 11 in the field region. Then, a portion of the substrate 10 corresponding to a gate formation region, is recessed by selective etching to form the groove 12 (recessed channel structure). Following this, well ion implantation, channel ion implantation processes and the like are sequentially performed in a state where a screen oxide film (not shown) has been formed on the surface of the substrate 10 including the groove 12. The channel ion implantation process is performed with an ion implantation dose of about 1E13 atoms/cm$^2$.

Thereafter, on the surface of the substrate 10 including the groove 12, a gate oxide film (not shown), a gate conductive film (not shown) and a gate hard mask film (not shown) are sequentially formed and then selectively etched to form the gate 16 in the groove 12. In FIG. 1, the reference numeral 13 designates a gate oxide film remaining after the etching, the reference numeral 14 designates a gate conductive film remaining after the etching, and the reference numeral 15 designates a gate hard mask film remaining after the etching. Next, low-concentration impurity ions are implanted into the substrate 10 at both sides of the gate 16 so as to form lightly doped drains (LDDs). Subsequently, a spacer 18 are formed on both sidewalls of the gate 16, and then, high-concentration impurity ions are implanted into the substrate 10 at both sides of the gate 16 including the spacer 18 so as to form the source and drain regions 19.

FIG. 2 shows problems occurring in the prior art and shows the simulation results for potential distribution in the cell transistor having the recessed channel structure. The simulation results were obtained under conditions where gate voltage is referenced to ground and a bias voltage of 1.0 V is applied to a storage node. In the method for manufacturing the transistor of a semiconductor device according to the prior art, as shown in FIG. 2, depletion regions in the channel regions corresponding to the sides of the gate 16 are greatly enlarged so as to cause leakage current. Thus, the data retention time of the device is shortened, resulting in deterioration in the refresh characteristics of the device. In FIG. 2, the reference character "A" designates a region with the most severe depletion.

SUMMARY OF THE INVENTION

Accordingly, the present invention has been made to solve the above-mentioned problems occurring in the prior method for manufacturing the transistor in the semiconductor device, and it is an object of the present invention to provide a method for manufacturing a transistor in a semiconductor device, which can inhibit the formation of depletion regions in channel regions corresponding to the sides of a gate having a recessed channel structure, so as to reduce the leakage current of the device and to increase the data retention time, thus improving the refresh characteristics of the device.

To achieve the above object, in one embodiment, the present invention provides a method for manufacturing a transistor in a semiconductor device, the method comprising the steps of: providing a silicon substrate having active and field regions defined thereon; performing a first channel ion implantation process into the silicon substrate; sequentially forming a hard mask film and a photoresist pattern exposing a gate formation region, on the substrate into which the first channel ion implantation process has been performed; performing a second channel ion implantation process into the substrate at a higher concentration than that of the first ion implantation process using the photoresist pattern as an ion implantation mask, so as to form doped regions in the substrate at the gate formation region and both sides adjacent thereto; etching a hard mask film using the photoresist pattern as an etch barrier; removing the photoresist pattern; etching the substrate using a portion of the hard mask film remaining after the etching as an etch barrier, so as to form a groove; removing the hard mask film remaining after the etching; forming a gate in the groove of the substrate from which the hard mask film has been removed; and forming source and drain regions on the substrate at both sides of the gate.

In the inventive method, the first channel ion implantation process is preferably performed using BF$_2$ as an ion implantation source.

Also, the first channel ion implantation process is preferably performed with an ion implantation dose of 1E12-3E13 atoms/cm$^2$ and an ion implantation energy of 10-50 keV.

Also, the first channel ion implantation process is preferably performed in tilt conditions of 3-7°.

Also, the hard mask film is preferably any one selected from the group consisting of a polycrystalline silicon film and a nitride film.

Also, the second channel ion implantation process is preferably performed using BF$_2$ as an ion implantation source.

Also, the second channel ion implantation process is preferably performed with an ion implantation dose of 5E13-5E14 atoms/cm$^2$ and an ion implantation energy of 30-50 keV.

Also, the second channel ion implantation process is preferably performed to an ion implantation depth ($R_p$) of 500-1,500 Å.

Also, the second channel ion implantation process is preferably performed in tilt conditions of 3-7°.

Also, the depth of the groove is preferably 300-2,000 Å.

Also, the step of forming the gate comprises the sub-steps of: sequentially forming a gate insulating film, a gate conductive film and a gate hard mask film on the substrate from which the hard mask film has been removed; and selectively etching the gate hard mask film, the gate conductive film and the gate insulating film.

Also, the gate insulating film is preferably any one selected from the group consisting of an oxide film and an oxynitride film.

Also, the gate insulating film is preferably made of a high-dielectric material.

Also, the high-dielectric material is preferably any one selected from the group consisting of $HfO_2$, $Hf_xSi_yO$, $Ta_2O_5$, $Al_2O_3$ and $ZrO_2$.

Also, the high-dielectric material is preferably deposited by an ALD process.

Moreover, the gate insulating film is preferably formed as a dual gate insulating film by forming an oxide film and then subjecting the oxide film to a reoxidation process.

In addition, the gate conductive film is preferably any one selected from the group consisting of a triple deposition film consisting of a polycrystalline silicon film, a $WN_x$ film and a W film, a double deposition film consisting of a polycrystalline silicon film and a $WSi_x$ film, a double deposition film consisting of a polycrystalline silicon film and a $CoSi_x$ film, a double deposition film consisting of a polycrystalline silicon film and a $NiSi_x$ film, a double deposition film consisting of a polycrystalline silicon film and a $CrSi_x$ film, a double deposition film consisting of a polycrystalline silicon film and a $TiSi_x$ film, a doped polycrystalline silicon film, and a poly-$Si_{1-x}Ge_x$ (x=0.01-0.99).

In another embodiment, the present invention provides a method for manufacturing a transistor in a semiconductor device, the method comprising the steps of: providing a silicon substrate having active and field regions defined thereon; sequentially forming a hard mask film and a photoresist pattern exposing a gate formation region, on the silicon substrate; performing a first channel ion implantation process into the substrate using the photoresist pattern as an ion implantation mask, so as to form doped regions in the substrate at the gate formation region and both sides adjacent thereto; etching the hard mask film using the photoresist pattern as an etch barrier; removing the photoresist pattern; etching the substrate using a portion of the hard mask film remaining after the etching, so as to form a groove; removing the hard mask film remaining after the etching; performing a second channel ion implantation process into the substrate from which the hard mask film has been removed; forming a gate in the groove of the substrate into which the second channel ion implantation process has been performed; and forming source and drain regions in the substrate at both sides of the gate, in which the first channel ion implantation process is performed at a higher concentration than the second channel ion implantation process.

In the method according to the second embodiment of the present invention, the first channel ion implantation process is preferably performed using $BF_2$ as an ion implantation source.

Also, the first channel ion implantation process is preferably performed with an ion implantation dose of 5E13-5E14 atoms/$cm^2$ and an ion implantation energy of 30-50 keV.

Also, the first channel ion implantation process is preferably performed to an ion implantation depth ($R_p$) of 500-1,500 Å.

Also, the first channel ion implantation process is preferably performed in tilt conditions of 3-7°.

Also, the second channel ion implantation process is preferably performed using $BF_2$ as an ion implantation source.

Also, the second channel ion implantation process is preferably performed with an ion implantation dose of 1E12-3E13 atoms/$cm^2$ and an ion implantation energy of 10-50 keV.

In addition, the second channel ion implantation process is preferably performed in tilt conditions of 3-7°.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

FIGS. 3a to 3g are cross-sectional views for explaining each step of a method for manufacturing a transistor in a semiconductor device according to the present invention.

Figure 1:
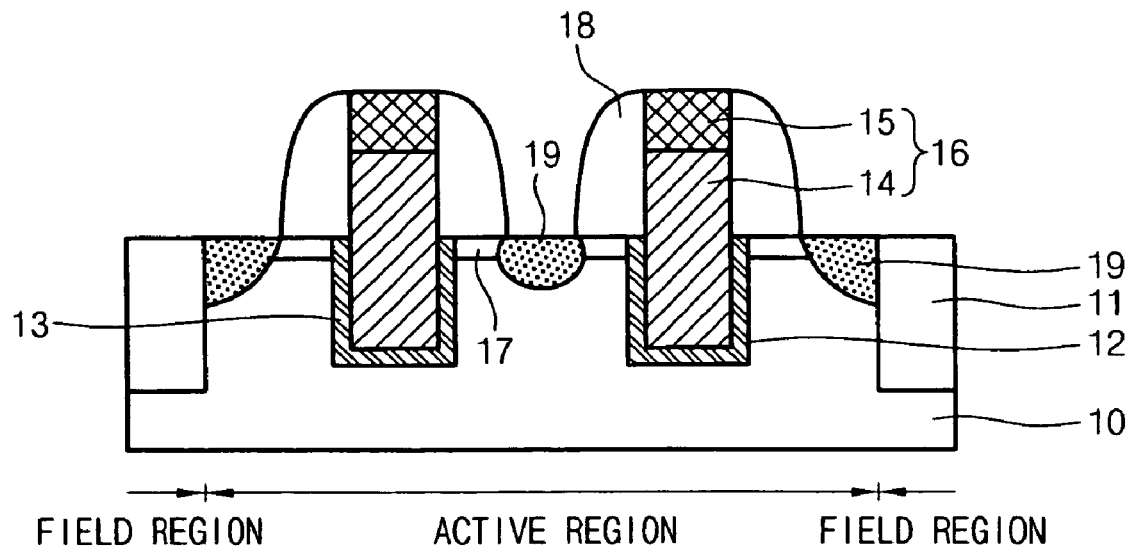
FIG. 1 is a cross-sectional view for explaining a method for manufacturing a transistor in a semiconductor device according to the prior art.
Figure 2:
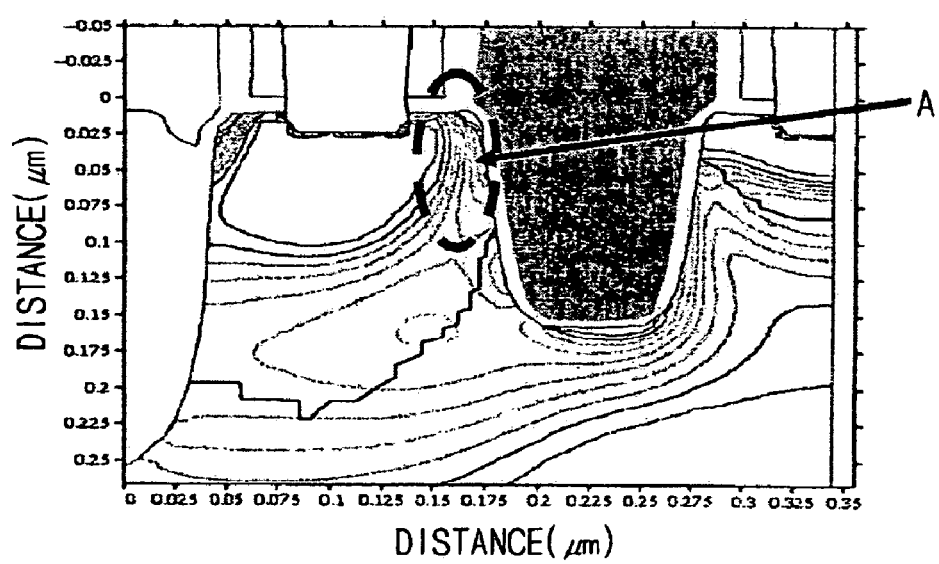
FIG. 2 shows problems occurring in the prior art.
Figure 3A:
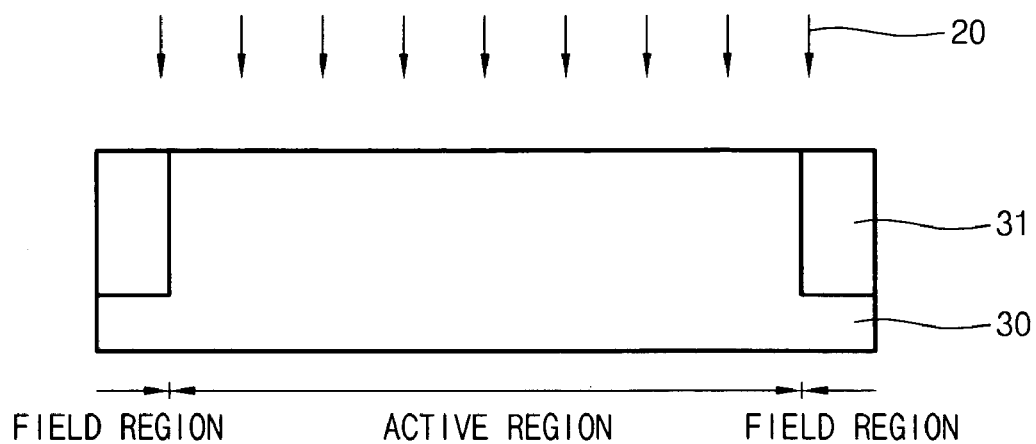
FIGS. 3a to 3g are cross-sectional views for explaining each step of a method for manufacturing a transistor in a semiconductor device according to the present invention.

As shown in FIG. 3a, the silicon substrate 30 is provided which has active and field regions defined thereon and the device isolation film 31 in the field region. Then, the resulting substrate is sequentially subjected to a well ion implantation process (not shown) and an annealing process (not shown), followed by the first channel ion implantation process 20. The first channel ion implantation process 20 is performed with an ion implantation dose of 1E12-3E13 atoms/$cm^2$ and an ion implantation energy of 10-50 keV. Also in the first channel ion implantation process, the wafer can be tilted at an angle of 3-7° in order to minimize a channeling effect caused by ion implantation.

Figure 3B:
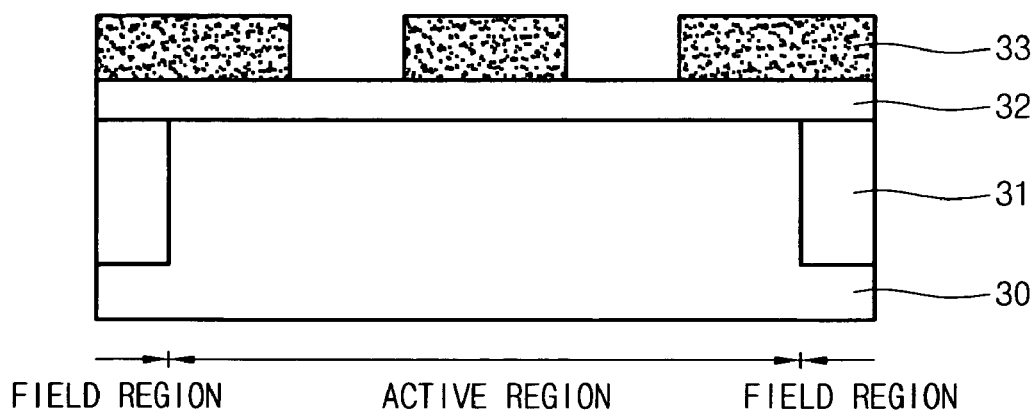

As shown in FIG. 3b, the hard mask film 32 and the photoresist pattern 33 exposing the gate formation region are sequentially formed on the resulting substrate. The hard mask film 32 is any one selected from the group consisting of a polycrystalline silicon film and a nitride film, in which the polycrystalline silicon film is formed by a low-pressure chemical vapor deposition (LPCVD) process using $SiH_4$ as a source. Between the silicon substrate 30 and the hard mask film 32, a screen oxide film (not shown) may be formed under an atmosphere of $O_2$ or $H_2$.

Figure 3C:
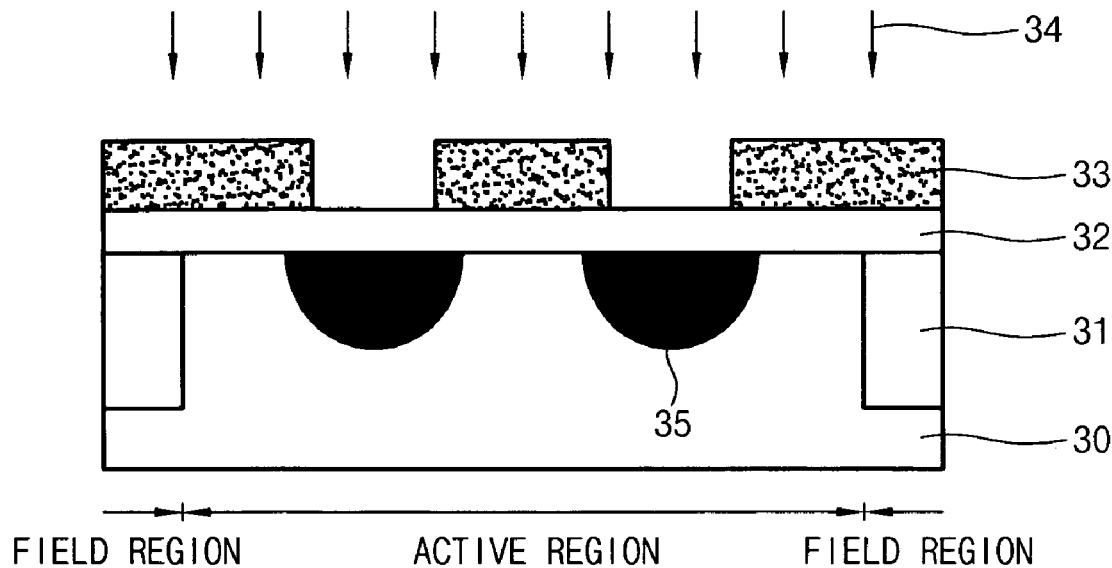

As shown in FIG. 3c, the substrate 30 is subjected to the second channel ion implantation process 34 using the photoresist pattern as an ion implantation mask, so as to form the doped regions 35 in the substrate at the gate formation region and both sides adjacent thereto. The second channel ion implantation process is performed in the following conditions: an ion implantation source: $BF_2$; ion implantation dose: 5E13-5E14 atoms/$cm^2$; ion implantation energy: 30-50 kev; and $R_p$: 500-1,500 Å. Also in the second ion implantation process 34, the wafer can be tilted at an angle of 3-7° in order to minimize a channeling effect caused by ion implantation.

The second channel ion implantation process 34 is performed with at least 10 times higher dose than that in the first channel ion implantation process 20. Thus, the doped regions 35 formed by the second channel ion implantation process 34 ensures that the doping concentration of channel regions corresponding to the sides of the subsequently formed gate having a recessed channel structure will be at least 10 times higher than the doping concentration of other channel regions. This can inhibit the formation of depletion regions in channel regions corresponding to the sides of the gate having the recessed channel structure.

Figure 3D:
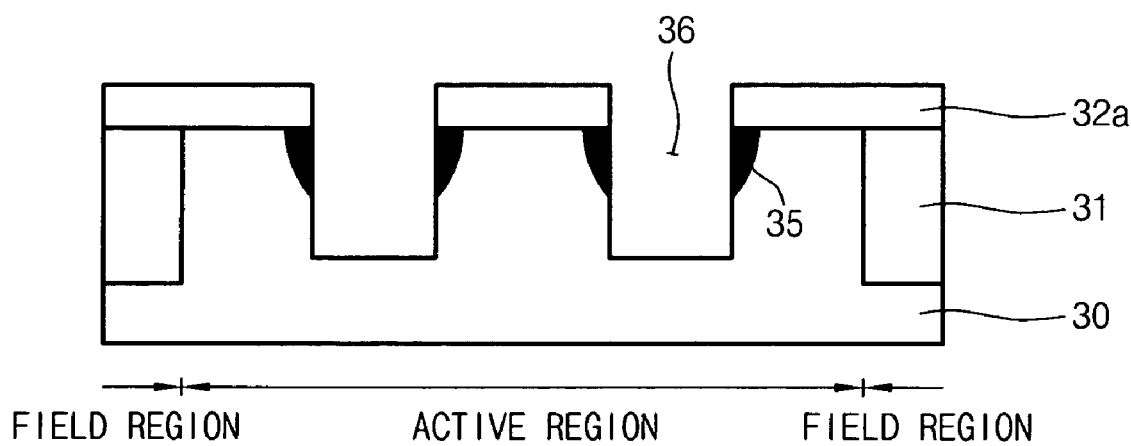

As shown in FIG. 3d, the hard mask film 32 is etched using the photoresist pattern 33 as an etch barrier, and then, the photoresist pattern 33 are removed using $O_3$ plasma. Subsequently, the resulting structure is wet cleaned. Following this, the silicon substrate 30 is recessed by etching using the hard mask 32a remaining after the etching as an etch barrier so as to form the groove 36 (recessed channel structure). The groove 12 has a depth of 300-2,000 Å.

Figure 3E:
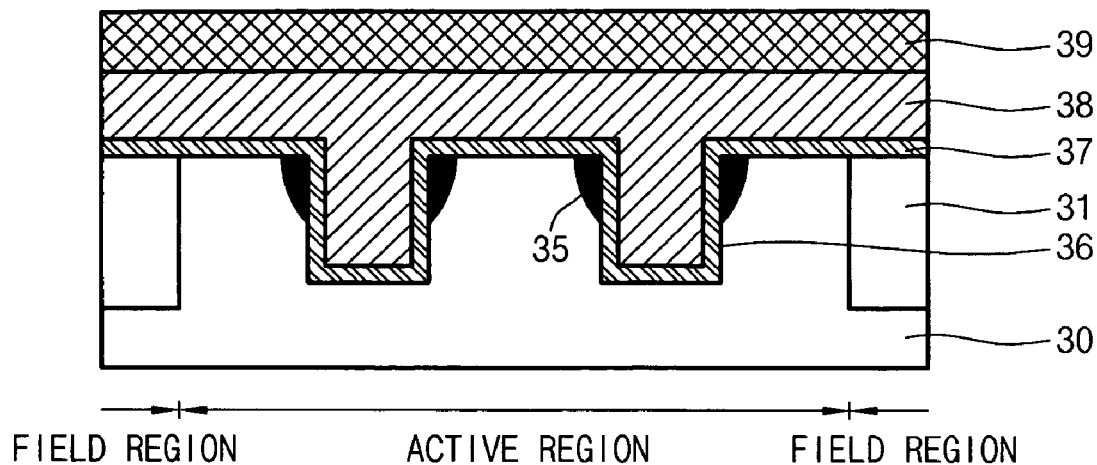

As shown in FIG. 3e, the hard mask film 32a remaining after the etching is removed. If the hard mask film 32a is a nitride film, it is then removed by wet etching with a phosphoric acid solution. Meanwhile, the first channel ion implantation process 20 may also be performed after removing the hard mask film 32a remaining after the etching, instead of performing after the well ion implantation process and the annealing process are sequentially performed.

Although not shown in the drawings, in order to recover from etch damage induced during the formation of the groove (36), the surface of the substrate 30 including is then oxidized. Next, the substrate 30 on which the oxidation process has been performed is subjected to a wet cleaning process using any one selected from the group consisting of HF and BOE. Following this, on the surface of the substrate 30 including the groove 36, the gate insulating film 37 is formed in a thickness of 10-100 Å. The gate insulating film 37 may be made of either an oxide film resulted from an oxidation process conducted in one atmosphere selected from the group consisting of $O_2$ and $H_2O$, or an oxynitride film obtained by subjecting the oxide film to a nitrification process using $N_2$ plasma. Moreover, the gate insulating film 37 may also be made of a high-dielectric material. The high-dielectric material is any one selected from the group consisting of $HfO_2$, $Hf_xSi_yO$, $Ta_2O_5$, $Al_2O_3$ and $ZrO_2$. This high-dielectric material layer is formed by an atomic layer deposition (ALD) process. Also, the gate insulating film 37 may also be formed as a dual gate oxide film by forming an oxide film and then subjecting the oxide film to a reoxidation process.

Thereafter, the gate conductive film 38 is formed on the gate insulating film 38 and subjected to chemical mechanical polishing (CMP) or etched back to planarize the surface. The gate conductive film 38 is formed in a thickness of 500-2,000 Å using doped polycrystalline silicon. Then, the gate hard mask film 39 is formed on the conductive film 38. The gate hard mask film 39 is made of any one selected from the group consisting of an $Si_3N_4$ film and an oxide film.

Figure 3F:
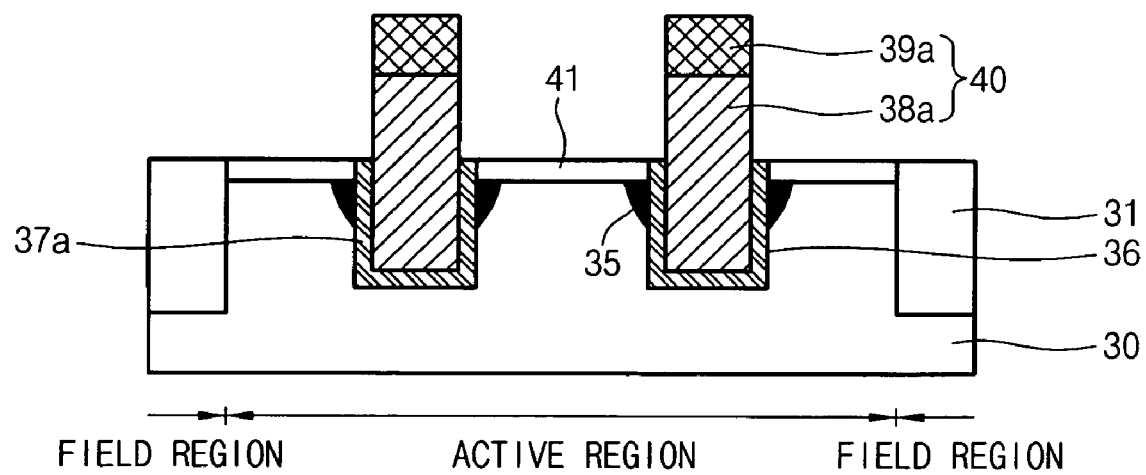

As shown in FIG. 3f, the gate hard mask film 39, the gate conductive film 38 and the gate insulating film 37 are selectively etched to form the gate 40 in the groove 36. In FIG. 3f, the reference numerals 37a, 38a and 39a designate a gate insulating film remaining after the etching, a gate conductive film remaining after the etching and a gate hard mask film remaining after the etching, respectively. Thereafter, in order to recover from etch damage induced in the formation of the gate 40, a reoxidation process is performed to grow an oxide film (not shown) on the side walls of the gate 40 and the surface of the silicon substrate 30. Then, impurity ions are selectively implanted into the resulting structure at a low concentration to form the LDD regions 41 in the substrate 30 at both sides of the gate 40.

Figure 3G:
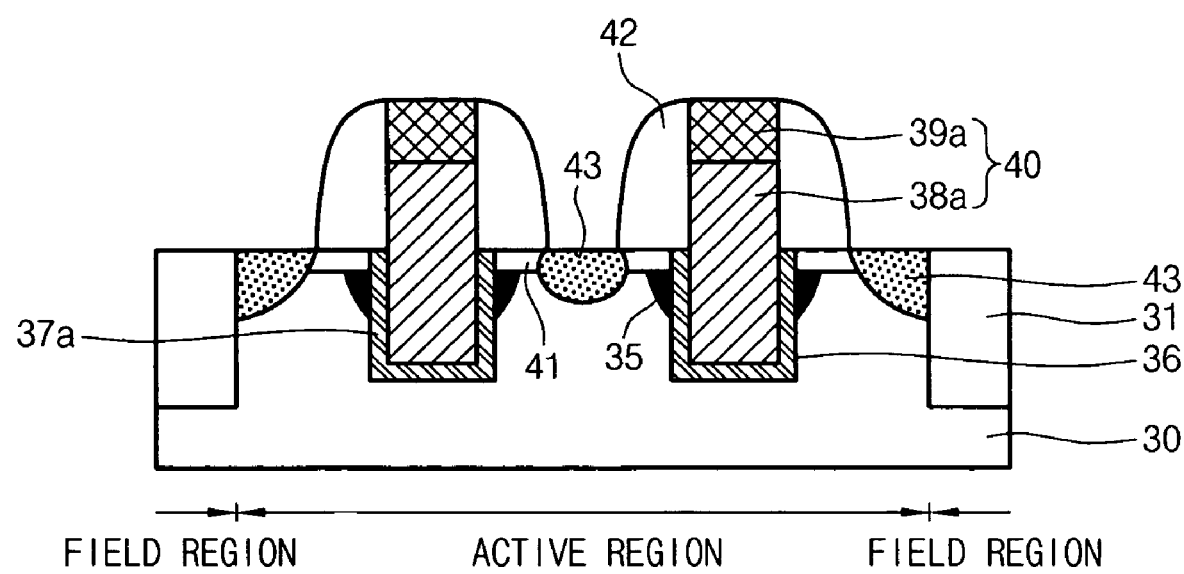

As shown in FIG. 3g, a spacer 42 is then formed on both sidewalls of the gate 40. Next, impurity ions are selectively implanted into the resulting structure at a high concentration to form source and drain regions 43 in the substrate 30 at both sides of the gate 40 including the spacer 42.

Meanwhile, although the gate conductive film 38 is a doped polycrystalline silicon film in the preferred embodiment of the present invention, the gate conductive film 38 may be any one selected from the group consisting of a triple deposition film consisting of a polycrystalline silicon film, a $WN_x$ film and a W film, a double deposition film consisting of a polycrystalline silicon film and a $WSi_x$ film, a double deposition film consisting of a polycrystalline silicon film and a $CoSi_x$ film, a double deposition film consisting of a polycrystalline silicon film and a $NiSi_x$ film, a double deposition film consisting of a polycrystalline silicon film and a $CrSi_x$ film, a double deposition film consisting of a polycrystalline silicon film and a $TiSi_x$ film, and a poly-$Si_{1-x}Ge_x$ (x=0.01-0.99) film.

As described above, according to the present invention, the process of implanting channel ions at a high concentration is additionally performed so as to ensure that the doping concentration of channel regions corresponding to the sides of the gate with a recessed channel structure will be at least 10 times higher than that of other channel regions. This can inhibit the formation of depletion regions in channel regions corresponding to the sides of the gate. Accordingly, the present invention allows leakage current to be reduced, and thus, allows the data retention time of the device to be increased, resulting in the improvement in the refresh characteristics of the device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a transistor in a semiconductor device, the method comprising the steps of:
   providing a silicon substrate having active and field regions defined thereon;
   performing a first channel ion implantation process into the silicon substrate;
   sequentially forming a hard mask film and a photoresist pattern exposing a gate formation region, on the substrate into which the first channel ion implantation process has been performed;
   performing a second channel ion implantation process into the substrate at a higher concentration than that of the first ion implantation process using the photoresist pattern as an ion implantation mask, so as to form doped regions in the substrate at the gate formation region and both sides adjacent thereto;
   etching a hard mask film using the photoresist pattern as an etch barrier;
   removing the photoresist pattern;
   etching the substrate using a portion of the hard mask film remaining after the etching as an etch barrier, so as to form a groove;
   removing the hard mask film remaining after the etching;
   forming a gate in the groove of the substrate from which the hard mask film has been removed; and forming source and drain regions on the substrate at both sides of the gate.

2. The method of claim 1, wherein the first channel ion implantation process is performed using $BF_2$ as an ion implantation source.

3. The method of claim 1, wherein the first channel ion implantation process is performed with an ion implantation dose of 1E12-3E13 atoms/cm$^2$ and an ion implantation energy of 10-50 keV.

4. The method of claim 1, wherein the first channel ion implantation process is performed in tilt conditions of 3-7°.

5. The method of claim 1, wherein the hard mask film is any one selected from the group consisting of a polycrystalline silicon film and a nitride film.

6. The method of claim 1, wherein the second channel ion implantation process is performed using $BF_2$ as an ion implantation source.

7. The method of claim 1, wherein the second channel ion implantation process is performed with an ion implantation dose of 5E13-5E14 atoms/cm$^2$ and an ion implantation energy of 30-50 keV.

8. The method of claim 1, wherein the second channel ion implantation process is performed to an ion implantation depth ($R_p$) of 500-1,500 Å.

9. The method of claim 1, wherein the second channel ion implantation process is performed in tilt conditions of 3-7°.

10. The method of claim 1, wherein the depth of the groove is 300-2,000 Å.

11. The method of claim 1, wherein the step of forming the gate comprises the sub-steps of:
sequentially forming a gate insulating film, a gate conductive film and a gate hard mask film on the substrate from which the hard mask film has been removed; and
selectively etching the gate hard mask film, the gate conductive film and the gate insulating film.

12. The method of claim 11, wherein the gate insulating film is any one selected from the group consisting of an oxide film and an oxynitride film.

13. The method of claim 11, wherein the gate insulating film is made of a high-dielectric material.

14. The method of claim 13, wherein the high dielectric material is any one selected from the group consisting of $HfO_2$, $Hf_xSi_yO$, $Ta_2O_5$, $Al_2O_3$ and $ZrO_2$.

15. The method of claim 13, wherein the high-dielectric material is deposited by an ALD process.

16. The method of claim 11, wherein the gate insulating film is formed as a dual gate insulating film by forming an oxide film and then subjecting the oxide film to a reoxidation process.

17. The method of claim 11, wherein the gate conductive film is any one selected from the group consisting of a triple deposition film consisting of a polycrystalline silicon film, a $WN_x$ film and a W film, a double deposition film consisting of a polycrystalline silicon film and a $WSi_x$ film, a double deposition film consisting of a polycrystalline silicon film and a $CoSi_x$ film, a double deposition film consisting of a polycrystalline silicon film and a $NiSi_x$ film, a double deposition film consisting of a polycrystalline silicon film and a $CrSi_x$ film, a double deposition film consisting of a polycrystalline silicon film and a $TiSi_x$ film, a doped polycrystalline silicon film, and a poly-$Si_{1-x}Ge_x$ (x=0.01-0.99).

18. A method for manufacturing a transistor in a semiconductor device, the method comprising the steps of:
providing a silicon substrate having active and field regions defined thereon;
sequentially forming a hard mask film and a photoresist pattern exposing a gate formation region, on the silicon substrate;
performing a first channel ion implantation process into the substrate using the photoresist pattern as an ion implantation mask, so as to form doped regions in the substrate at the gate formation region and both sides adjacent thereto;
etching the hard mask film using the photoresist pattern as an etch barrier;
removing the photoresist pattern;
etching the substrate using a portion of the hard mask film remaining after the etching, so as to form a groove;
removing the hard mask film remaining after the etching;
performing a second channel ion implantation process into the substrate from which the hard mask film has been removed;
forming a gate in the groove of the substrate into which the second channel ion implantation process has been performed; and
forming source and drain regions in the substrate at both sides of the gate,
in which the first channel ion implantation process is performed at a higher concentration than that in the second channel ion implantation process.

19. The method of claim 18, wherein the first channel ion implantation process is performed using $BF_2$ as an ion implantation source.

20. The method of claim 18, wherein the first channel ion implantation process is performed with an ion implantation dose of 5E13-5E14 atoms/cm$^2$ and an ion implantation energy of 30-50 keV.

21. The method of claim 18, wherein the first channel ion implantation process is performed to an ion implantation depth ($R_p$) of 500-1,500 Å.

22. The method of claim 18, wherein the first channel ion implantation process is performed in tilt conditions of 3-7°.

23. The method of claim 18, wherein the second channel ion implantation process is performed using $BF_2$ as an ion implantation source.

24. The method of claim 18, wherein the second channel ion implantation process is performed with an ion implantation dose of 1E12-3E13 atoms/cm$^2$ and an ion implantation energy of 10-50 keV.

25. The method of claim 18, wherein the second channel ion implantation process is performed in tilt conditions of 3-7°.

* * * * *